(12) United States Patent
Hajibabaeinajafabadi et al.

(10) Patent No.: US 12,002,683 B2
(45) Date of Patent: Jun. 4, 2024

(54) LATERAL ETCHING OF SILICON

(71) Applicant: Tokyo Electron Limited, Tokyo (JP)

(72) Inventors: Hamed Hajibabaeinajafabadi, Albany, NY (US); Pingshan Luan, Albany, NY (US); Aelan Mosden, Albany, NY (US); Sergey Voronin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 200 days.

(21) Appl. No.: 17/713,723

(22) Filed: Apr. 5, 2022

(65) Prior Publication Data

US 2023/0317465 A1   Oct. 5, 2023

(51) Int. Cl.
| | | |
|---|---|---|
| H01L 21/3213 | (2006.01) | |
| H01L 21/02 | (2006.01) | |
| H01L 21/311 | (2006.01) | |
| H01L 29/40 | (2006.01) | |
| H01L 29/66 | (2006.01) | |

(52) U.S. Cl.
CPC .. *H01L 21/31116* (2013.01); *H01L 21/02532* (2013.01); *H01L 29/66439* (2013.01); *H01L 29/66742* (2013.01)

(58) Field of Classification Search
None
See application file for complete search history.

(56) References Cited

U.S. PATENT DOCUMENTS

| | | |
|---|---|---|
| 8,389,416 B2 | 3/2013 | Luong |
| 9,997,598 B2 | 6/2018 | Smith et al. |
| 10,177,227 B1 | 1/2019 | Yoshida et al. |
| 10,263,100 B1* | 4/2019 | Bi ............... H01L 29/42364 |
| 11,069,819 B2 | 7/2021 | Frougier |

(Continued)

FOREIGN PATENT DOCUMENTS

KR   20220016359 A   2/2022

OTHER PUBLICATIONS

International Searching Authority, "Notification of Transmittal of The International Search Report and the Written Opinion of The International Searching Authority, or the Declaration," International application No. PCT/US2023/063332, dated Jun. 23, 2023, 10 pages.

(Continued)

*Primary Examiner* — Allan W. Olsen
(74) *Attorney, Agent, or Firm* — Slater Matsil, LLP

(57) ABSTRACT

A method of processing a substrate that includes: positioning a substrate in a plasma processing chamber, the substrate including a layer stack of alternating layers of silicon (Si) layers and silicon-germanium (SiGe) layers, the substrate including a recess that exposes sidewalls of the Si layers and sidewalls of the SiGe layers; flowing a first process gas into the plasma processing chamber; while flowing the first process gas, pulsing a second process gas into the plasma processing chamber at a pulsing frequency; while flowing the first process gas and pulsing the second process gas, applying power to a source electrode and a bias electrode of the plasma processing chamber to generate a plasma in the plasma processing chamber; and exposing the substrate to the plasma to laterally etch a portion of the Si layers selectively to the SiGe layers and form indents between the SiGe layers.

20 Claims, 8 Drawing Sheets

(56) References Cited

U.S. PATENT DOCUMENTS

| | | |
|---|---|---|
| 2020/0266060 A1 | 8/2020 | Cheng et al. |
| 2020/0266070 A1 | 8/2020 | Voronin et al. |
| 2021/0193477 A1 | 6/2021 | Ishikawa et al. |
| 2021/0351281 A1 | 11/2021 | Lin et al. |

OTHER PUBLICATIONS

Mertens et al., "Si-cap-free SiGe p-Channel FinFETs and Gate-All-Around Transistors in a Replacement Metal Gate Process: Interface Trap Density Reduction and Performance Improvement by High-Pressure Deuterium Anneal", 2015 Symposium on VLSI Technology Digest of Technical Papers, T142-T143, 2 pages total.

* cited by examiner

LATERAL ETCHING OF SILICON

TECHNICAL FIELD

The present invention relates generally to a method of processing a substrate, and, in particular embodiments, to lateral silicon etching.

BACKGROUND

The improvement of integrated circuit (IC) manufacturing has largely been driven by increasing device density to improve speed, performance, and manufacturing costs. With the scaling to smaller node sizes, IC device architectures have evolved from two-dimensional (2D) planar structures to three-dimensional (3D) vertical structures, such as fin field-effect transistors (FinFET). The further development of 3D device structures has led to the concept of gate-all around (GAA) devices comprising nanosheet or nanowire structures. A nanosheet or nanowire (nanosheet/nanowire) transistor may offer increased effective width and device performance, and is thereby expected to be a promising candidate for the replacement of FinFET at the 5 nm node and beyond.

Some of the unique features in manufacturing nanosheet/nanowire transistors compared to FinFET are stacked sheets formation by epitaxy, inner spacer formation, a dummy gate formation followed by channel release, and multi-threshold voltage processing. Owing to these features, manufacturing processes for nanosheet/nanowire transistors tend to be more complicated and pose unique challenges in fabrication and material selection. Further development of manufacturing processes is therefore needed for the implementation of nanosheet/nanowire transistors.

SUMMARY

In accordance with an embodiment of the present invention, a method of processing a substrate that includes: positioning a substrate in a plasma processing chamber, the substrate including a layer stack of alternating layers of silicon (Si) layers and silicon-germanium (SiGe) layers, the substrate including a recess that exposes sidewalls of the Si layers and sidewalls of the SiGe layers; flowing a first process gas into the plasma processing chamber; while flowing the first process gas, pulsing a second process gas into the plasma processing chamber at a pulsing frequency, the second process gas being different from the first process gas; while flowing the first process gas and pulsing the second process gas, applying power to a source electrode and a bias electrode of the plasma processing chamber to generate a plasma in the plasma processing chamber; and exposing the substrate to the plasma to laterally etch a portion of the Si layers selectively to the SiGe layers and form indents between the SiGe layers.

In accordance with an embodiment of the present invention, a method of processing a substrate that includes: forming a recess over a substrate, the substrate including a layer stack of alternating layers of silicon (Si) layers and silicon-germanium (SiGe) layers, the recess exposing sidewalls of the Si layers and sidewalls of the SiGe layers; forming passivation layers on surfaces of the SiGe layers, the surfaces including the exposed sidewalls of the SiGe layers, the forming including flowing a first component gas into a plasma processing chamber, generating a first plasma within the plasma processing chamber, and exposing the substrate to the first plasma; and laterally etching a portion of the Si layers to form indents between the SiGe layers, the laterally etching including flowing a second component gas into the plasma processing chamber, generating a second plasma within the plasma processing chamber, exposing the substrate to the second plasma, and where the second plasma is different from the first plasma, and where the passivation layers inhibit an etching of the SiGe layers by the second plasma.

In accordance with an embodiment of the present invention, a method of processing a substrate that includes: forming a plurality of vertical recesses in a layer stack, the layer stacking being disposed over the substrate, the layer stack including alternating layers of a nanosheet layer including germanium (Ge) and a sacrificial layer including silicon (Si), the substrate further including a dummy gate formed over the layer stack, the plurality of vertical recesses exposing sidewalls of the nanosheet layer and sidewalls of the sacrificial layer; exposing the substrate to a plasma including nitrogen within a plasma processing chamber to induce nitridation of a portion of surfaces of the nanosheet layer, the plasma being generated by flowing a first process gas including nitrogen to the plasma processing chamber; while maintaining the plasma and flowing the first process gas, pulsing a second process gas including fluorine to the plasma processing chamber to supply fluorine to the plasma, where the plasma supplied with fluorine laterally etches a portion of the sacrificial layer and forms a plurality of lateral recesses between adjacent nanosheets; depositing an inner sidewall spacer layer to fill the plurality of lateral recesses; and etching a portion of the inner sidewall spacer layer to expose tips of the nanosheets, the remaining portion of the inner sidewall spacer layer forming an inner sidewall spacer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of an example substrate during a fabrication process comprising a lateral etch process at various stages in accordance with various embodiments, wherein FIG. 1A illustrates the incoming substrate comprising a later stack of alternating nanosheets and sacrificial layers, FIG. 1B illustrates the substrate after a fin etch back, FIG. 1C illustrates the substrate during a passivation phase of the lateral etch process, and FIG. 1D illustrates the substrate during an etch phase of the lateral etch process;

FIGS. 2A and 2B illustrate cross-sectional views of alternating nanosheets and sacrificial layers exposed to a plasma during a lateral etch process in a plasma processing chamber in accordance with various embodiments, wherein FIG. 2A illustrates the formation of passivation layers over the nanosheets, and FIG. 2B illustrates the lateral etching of the sacrificial layers;

FIGS. 6A-6C illustrate example process flow diagrams of the fabrication process comprising a lateral etch process, wherein FIG. 6A illustrates an embodiment, FIG. 6B illustrates an alternate embodiment, and FIG. 6C illustrates yet another embodiment.

DETAILED DESCRIPTION OF ILLUSTRATIVE EMBODIMENTS

This application relates to fabrication of semiconductor devices, for example, 3-D devices such as gate-all-around field effect transistors (GAAFETs), and more particularly to lateral silicon etching. Fabricating GAAFETs and other GAA devices typically involves forming and fabricating a layer stack of alternating nanosheets for channels and sacrificial layers for separating the nanosheets. One of the key processes in the fabrication relates to forming desired indents between the nanosheets by laterally etching a portion of the sacrificial layers. Conventional etch techniques, however, suffer various issues including poor etch selectivity of the sacrificial layers to the nanosheets, pitting, and surface roughness of the formed indents. Therefore, new methods for laterally etching while minimizing these issues may be desired.

Embodiments of the present application disclose methods of selective lateral etching. The lateral etch process in various embodiments comprises a plasma process that combines a passivation phase and an etch phase. The passivation phase and the etch phase may be switched and repeated by dynamically controlling the composition and other compositions of the plasma. For example, a fluorine agent may be pulsed to a plasma comprising nitrogen and hydrogen to periodically switch between the two phases. A passivation layer that is formed during the passivation phase may protect the nanosheets during the etch phase that laterally etches the sacrificial layers. In various embodiments, the methods disclosed in the present application may be applied to lateral etching of silicon (Si) selective to silicon-germanium (SiGe) alloy. Such embodiments may enable the formation of indents between SiGe layers with improved etch selectivity and surface roughness profile without causing pitting.

Figure 2A:
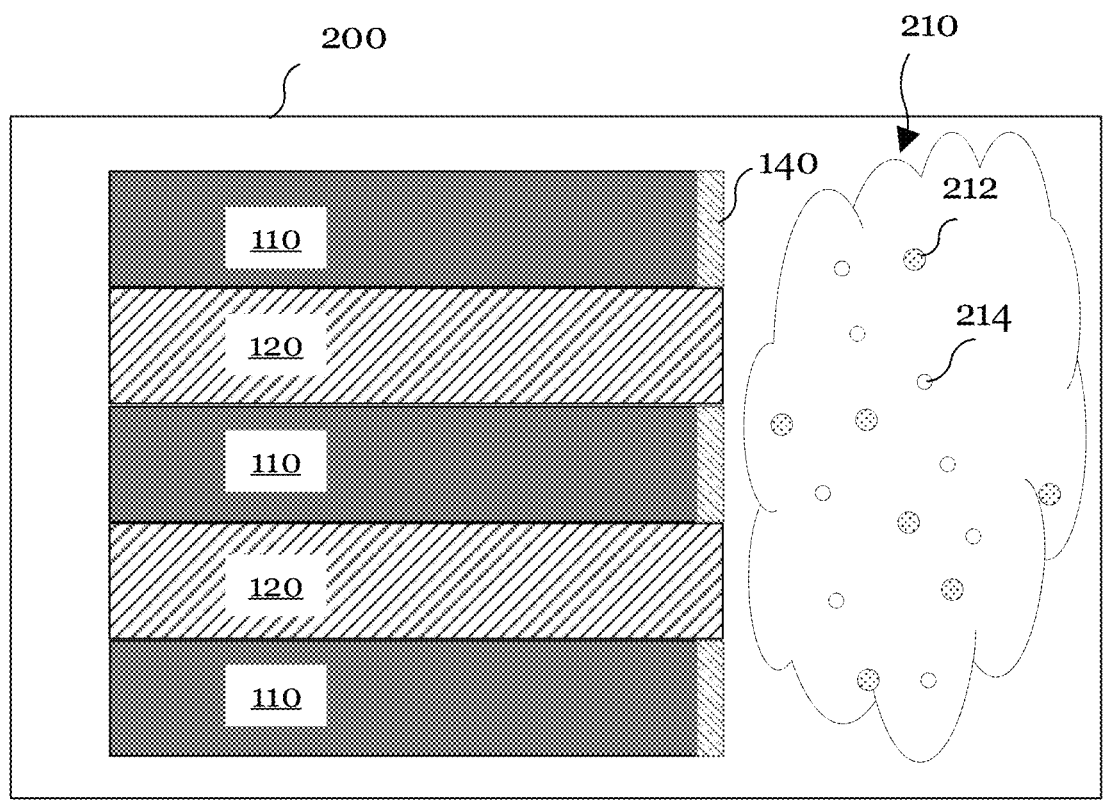
Figure 2B:
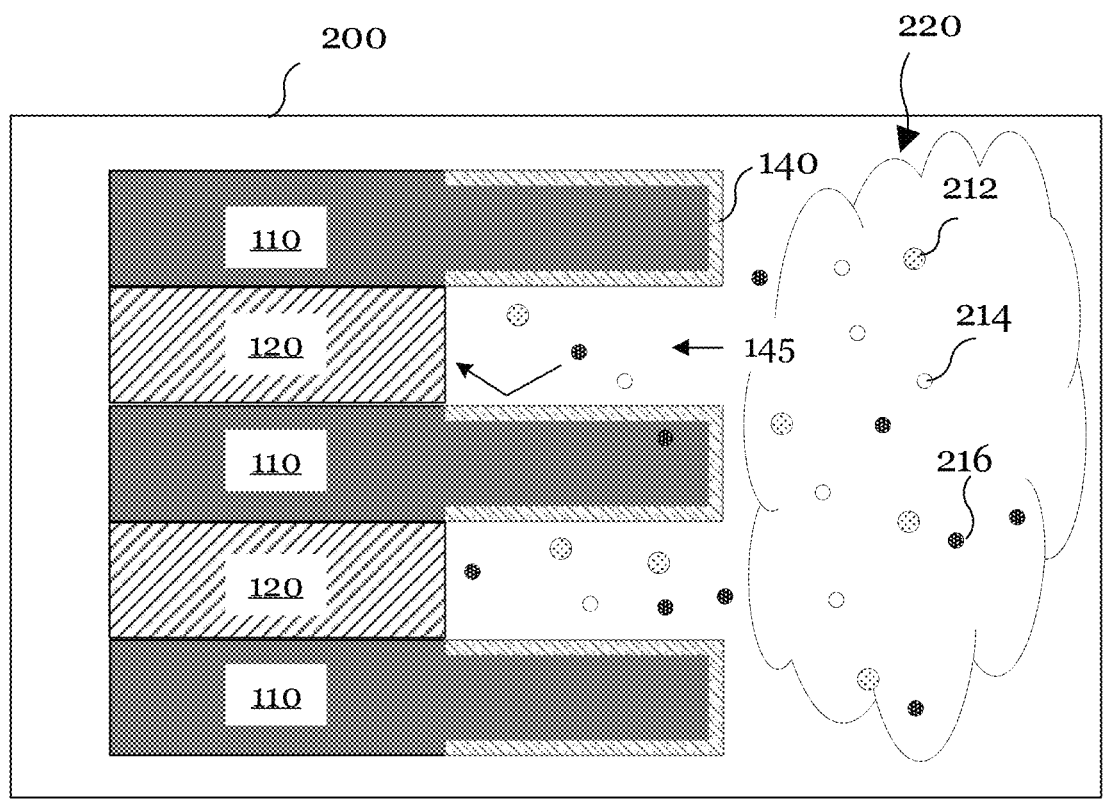
Figure 3:
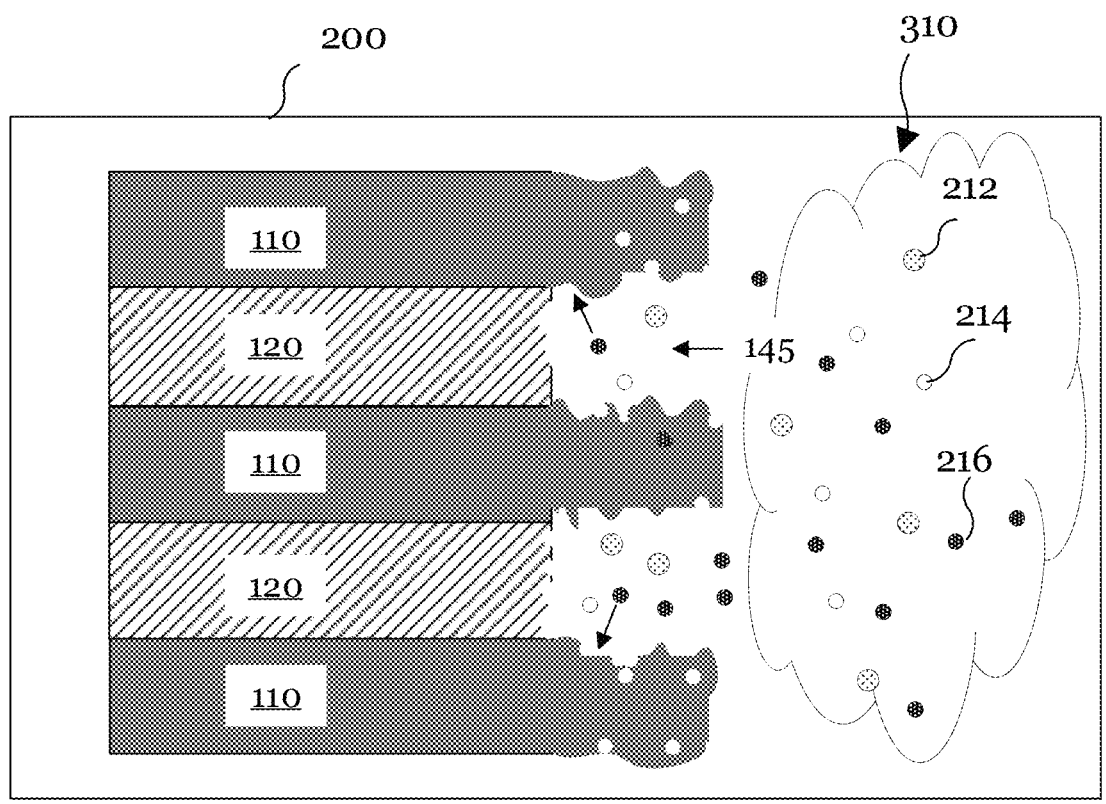
FIG. 3 illustrates a cross-sectional view of alternating nanosheets and sacrificial layers during a lateral etch process in a plasma processing chamber that suffers pitting, selectivity, and roughness issues.

In the following, steps of a fabrication process comprising a lateral etch process are first described referring to FIGS. 1A-1D in accordance with various embodiments. Two phases of the lateral etch process (i.e., passivation and etch) in a plasma processing chamber are also described in FIGS. 2A-2B along with FIGS. 1C-1D. In comparison, referring to FIG. 3, issues of poor etch selectivity, pitting, and surface roughness by conventional techniques are described. An example gate-all-around (GAA) device enabled by a fabrication process comprising the lateral etch process is described referring to FIG. 4. In accordance with certain embodiments, pulsing of a second process gas along with a continuous flow of a first process gas for the lateral etch process is described using a timing diagram illustrated in FIG. 5. Example process flow diagrams are illustrated in FIG. 6A-6C. All figures in this disclosure are drawn for illustration purpose only and not to scale, including the aspect ratios of features. Although the description below in this disclosure is mainly for selective lateral etching of Si to SiGe, other materials may be etched using the method in other embodiments.

Figure 1A:
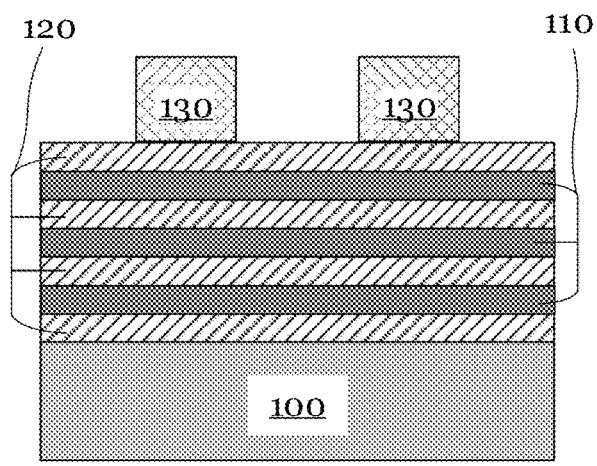

FIGS. 1A-1D illustrate cross-sectional views of an example substrate 100 during a fabrication process comprising a lateral etch process at various stages in accordance with various embodiments. FIG. 1A illustrates a cross-sectional view of the incoming substrate 100 comprising a later stack of alternating nanosheets 110 and sacrificial layers 120.

In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed. In certain embodiments, the substrate 100 is to be fabricated to a gate-all-around field effect transistor (GAAFET).

In one or more embodiments, the substrate 100 may be a silicon wafer, or a silicon-on-insulator (SOI) wafer. In certain embodiments, the substrate 100 may comprise silicon germanium, silicon carbide, gallium arsenide, gallium nitride and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As further illustrated in FIG. 1A, the substrate 100 may comprise the nanosheets 110 formed therein. Specifically, the nanosheets no are embedded in a different material. The nanosheets 110 may be spaced apart from each other by one of the sacrificial layers 120. Thus, the substrate 100 comprises alternating layers of the nanosheets 110 and the sacrificial layers 120. It should be noted that while three layers of the nanosheets 110 are depicted in FIG. 1A, the number of layers is not limited. In various embodiments, the nanosheets 110, at the end of fabrication, may form the transistor channels, while the sacrificial layers 120 will be removed in a later step of fabrication to free up a void space for the formation of gate dielectric and gate terminal. In various embodiments, the nanosheets 110 may comprise silicon-germanium alloy (SiGe) and the sacrificial layers 120 may comprise silicon (Si), and a p-type field effect transistors (FET) may be formed using the SiGe to improve hole mobility. For example, the lateral etch process described below in FIGS. 1A-1D may be integrated into a process for fabricating the nanosheets 110 into respective nanowires for a channel region of a GAAFET.

In certain embodiments, the nanosheets 110 may comprise pure Ge. As a particular example, the SiGe used for the nanosheets 110 may comprise a SiGe alloy (mixture) in an appropriate ratio (e.g., $Si_{0.7}Ge_{0.3}$, $Si_{0.75}Ge_{0.25}$, etc.) for desired materials properties such as electrical properties of a given application or for desired performance in a resulting semiconductor device. In certain embodiments, the nanosheets 110 may comprise 5-50% germanium. The nanosheets 110 may further comprise other elements such as dopants (e.g., N, B, and P) in addition to the main components (e.g., Si and Ge) In certain embodiments, all of the nanosheets 110 have the same compositions; however, each or some of the nanosheets 110 may have different compositions if desired in other embodiments.

In various embodiments, the nanosheets 110 have thickness of a few nanometers to tens of nanometer, for example, about 1 nm to about 20 nm in one embodiment. In another embodiment, the nanosheets 110 have thickness of about 1 nm to about 10 nm in one embodiment.

In certain embodiments, a stack of the nanosheets 110 and the sacrificial layers 120 may be formed by deposition processes, for example, epitaxially by a chemical vapor deposition (CVD) method. In various embodiments, each layer of the sacrificial layers 120 and the nanosheets 110 may be few to several nanometers in thickness. In one embodiment, each layer of the sacrificial layers 120 may have a thickness between 5 nm and 20 nm and each layer of the nanosheets 110 may have a thickness between 1 nm and 10 nm. Additionally, the nanosheets 110 may have the same thicknesses or may vary in thickness relative to one another, the sacrificial layers 120 may have the same thickness or may vary in thickness relative to one another, and the nanosheets 110 and the sacrificial layers 120 may have the same thicknesses or may vary in thickness relative to one another.

Still referring to FIG. 1A, the patterned hard mask layer 130 may be formed over the layer stack of the nanosheets 110 and the sacrificial layers 120. The hard mask used for the patterned hard mask layer 130 may comprise silicon oxide in one embodiment. In various embodiments, the hard mask may comprise silicon nitride (SiN), silicon carbonitride (SiCN), or silicon oxycarbide (SiOC). In alternate embodiments, the hard mask may comprise titanium nitride. Further, the hard mask may be a stacked hard mask comprising, for example, two or more layers using two different materials. A first hard mask of the patterned hard mask layer 130 may comprise a metal-based layer such as titanium nitride, titanium, tantalum nitride, tantalum, tungsten-based compounds, ruthenium-based compounds, or aluminum based compounds, and a second hard mask may comprise a dielectric layer such as $SiO_2$, silicon nitride, SiCN, SiOC, silicon oxynitride, silicon carbide, amorphous silicon, or polycrystalline silicon. The hard mask may be deposited using deposition techniques such as vapor deposition including chemical vapor deposition (CVD), physical vapor deposition (PVD), as well as other plasma processes such as plasma enhanced CVD (PECVD), sputtering, and other processes. The hard mask may have a thickness of about 5 nm to about 50 nm in certain embodiments. The patterning of the hard mask may be performed by a conventional photolithographic process. For example, such a conventional process may comprise spin coating a photoresist over the hard mask, performing a lithographic exposure to react a portion of the photoresist for patterning, developing the photoresist to form a relief pattern, and transferring the relief pattern to the hard mask by an anisotropic etch.

The substrate 100 illustrated in FIG. 1A is for example only, and may further comprise other layers useful for fabrication. For example, the substrate 100 may further comprise an optional dielectric blocking layer on top of the layer stack and below the hard mask. The dielectric blocking layer may comprise an oxide and be used as an etch stop layer during one or more of the fabrication steps. In further embodiments, the substrate 100 may further comprise a dummy stack structure between the layer stack and the hard mask. The dummy stack may comprise a dummy gate comprising polysilicon or amorphous silicon and sidewall spacers (e.g., SiN) in one embodiment.

Figure 1B:
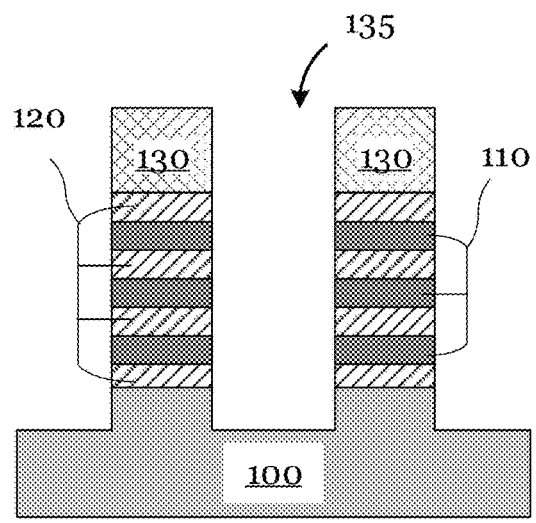

FIG. 1B illustrates a cross-sectional view of the substrate 100 after a fin etch back.

In FIG. 1B, an anisotropic etching may be performed to form vertical recesses 135. Using the patterned hard mask layer 130 as an etch mask, a portion of the nanosheets 110 and a portion of the sacrificial layers 120 are removed, forming fin features, which may form the channel regions of the transistors at the end of fabrication, separated by each of the vertical recesses 135. The vertical recesses 135 expose sidewalls of the nanosheets 110 and sidewalls of the sacrificial layers 120. In various embodiments, this fin etch back process may comprise one or more wet etch processes, plasma etch processes such as reactive ion etch (RIE) processes, or combinations of these or other etch processes. In certain embodiments, a wet or dry etch cleaning process may be performed after the fin etch back process. In one embodiment, a dilute hydrogen fluoride (DHF) aqueous solution may be used in the cleaning process. Similar wet or dry cleaning processes may be performed at various stages of fabrication.

After forming the vertical recesses 135, indents may be formed between the nanosheets 110 by etching a portion of the sacrificial layer 120 from both ends of the sacrificial layer 120 exposed at the sidewalls. The lateral etch process in various embodiments may be applied at this stage of fabrication to selectively etch the sacrificial layer 120 while inhibiting the etching of the nanosheets 110.

Figure 1C:
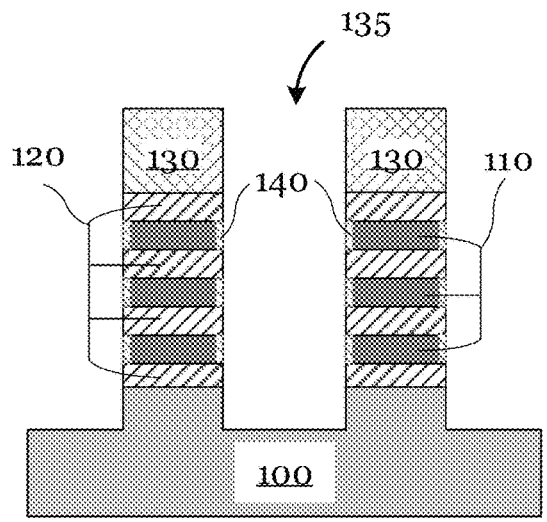

FIG. 1C illustrates a cross-sectional view of the substrate 100 during a passivation phase of a lateral etch process. FIG. 2A illustrates a cross-sectional view of alternating nanosheets 110 and sacrificial layers 120 during the formation of passivation layers 140 over the nanosheets 110 a lateral etch process in accordance with various embodiments.

At the start of the lateral etch process, the substrate 100 may first be exposed to a plasma generated from a first process gas to form passivation layers 140 as illustrated in FIGS. 1C and 2A. In various embodiments, as illustrated in FIG. 2A, a first plasma 210 may be generated in a plasma processing chamber 200 from the first process gas, and the surface of the sidewalls of the nanosheets 110 may be reacted to form the passivation layers 140. In certain embodiments, the first plasma 210 may comprise nitrogen species 212 and hydrogen species 214 (FIG. 2A). The nitrogen species 212 and the hydrogen species 214 may exist as atomic or molecular ions or radicals, or their combinations. Accordingly, the first process gas may comprise nitrogen and hydrogen. In one or more embodiments, the first process gas may comprise $N_2$ and $H_2$. In another embodiment, the first process gas may comprise ammonia ($NH_3$), or any combination of $NH_3/H_2/N_2$.

Although the passivation layers 140 may have any suitable thickness, in certain embodiments, the passivation layers 140 may be relatively thin, such as 2 nm or less. The passivation layers 140 may be, for example, a monolayer thick. In various embodiments, the passivation layers 140 may comprise a nitride formed by the nitridation of the surfaces of the nanosheets 110 using the nitrogen species 212 of the first plasma 210. The nitride-based passivation layers may advantageously improve the etch selectivity while minimizing the consumption of the nanosheets 110 compared to other types of passivation layers such as oxide-based. Accordingly, in one or more embodiments, the first progress gas and the first plasma 210 may be essentially oxygen-free. In certain embodiments, the first process gas may also include a carrier gas such as a noble gas (e.g., He, Ne, Ar, and Kr). In various embodiments, the first plasma 210 comprises little to no etchant such that effectively no etching occurs. In one embodiment, the first process gas may be essentially fluorine-free. In various embodiments, a nitride may be formed as the passivation layers 140 via reactions between the surface of the nanosheets 110 (e.g., SiGe) with the nitrogen species 212 of the first plasma 210.

The reactivity of the nitrogen species 212 may be different between the surfaces of the nanosheets 110 (e.g., SiGe) and the surfaces of the sacrificial layers 120 (e.g., Si), enabling the selective formation of the passivation layer 140 only over the nanosheets 110. It should be noted, in certain embodiments, a similar reaction may occur on the surfaces of the sacrificial layers 120 during the exposure to the first plasma 210 (i.e., the passivation phase) and an additional layer may be formed over the sacrificial layer 120. The additional layer that may be formed over the sacrificial layer 120 may or may not be similar in composition to the passivation layer 140. In one embodiment, although not wishing to be limited by any theory, the additional layer may be similar in composition to the passivation layer 140 but has a thickness substantially smaller than the passivation layer 140 such that the selectivity during the etch phase is not disabled. In another embodiment, the difference in composition between the additional layer and the passivation layer 140 may be large enough such that the etch rate of the additional layer during the etch phase is substantially greater than that of the passivation layer 140. This may be enabled due to the different surface chemistry over the sacrificial layer 120 and the nanosheets 110 during the passivation phase. These two factors (i.e., thickness and composition) of the passivation layer 140, with or without the additional layer, may play a role in affecting the etch selectivity individually or concertedly. The inventors of this application identified that such an additional layer may be successfully removed during the etch phase. In further embodiments, an exposure time for the first plasma 210 may be optimized so that it is sufficient to form the passivation layers 140 but not to form excessive additional layers over the sacrificial layers 120. In one embodiment, the exposure time for the first plasma 210 may be between 5 s and 5 min, and in other embodiments, between 10 s and 30 s. In various embodiments, the exposure time for the first plasma 210 may be optimized in consideration of the relationship with the process time for the etch phase so that the subsequent lateral etch process may be efficient and selective.

Figure 1D:
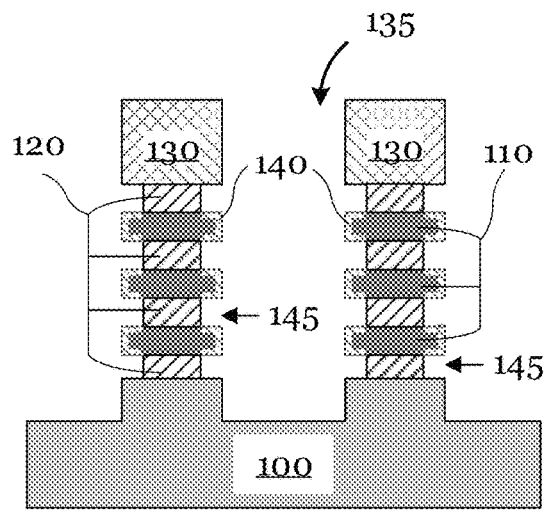

FIG. 1D illustrates a cross-sectional view of the substrate 100 during an etch phase of the lateral etch process. FIG. 2B illustrates a cross-sectional view of alternating nanosheets 110 and sacrificial layers 120 during the etching of the sacrificial layers 120 during the etch phase.

After the formation of the passivation layers 140, the etch phase of the lateral etch process may be started by realizing a plasma condition that comprises an etchant. In FIGS. 1D and 2B, selective removal of a portion of the sacrificial layers 120 from both ends of the sacrificial layers 120 forms lateral recesses 145 as indents between the nanosheets 110. In various embodiments, the lateral recesses 145 may have a lateral depth between 10 nm and 50 nm. In another embodiment, the lateral depth may be between 20 nm and 200 nm. In certain embodiments, the lateral recesses 145 may be formed by repeating the passivation phase and the etch phase as a part of a cyclic process. Each cycle of the cyclic process may laterally etch between a few monolayers to tens of nanometers of the nanosheets 110. During the etch phase, the passivation layers 140 provides the protection of the nanosheets 110 against etching. In various embodiments, as illustrated in FIG. 2B, the etch phase of the lateral etch process may be realized by changing a plasma composition from the passivation phase of FIG. 2A. A second plasma 220, having a different composition from the first plasma 210, may be generated in the plasma processing chamber 200 to provide the etchant for the sacrificial layers 120, enabling the etch phase. In certain embodiments, the second plasma 220 may comprise nitrogen species 212, hydrogen species 214, and fluorine species 216 (FIG. 2B). Any of these species may exist as atomic or molecular ions or radicals, or their combinations. Although not wishing to be limited by any theory, for example, the fluorine species 216 (e.g., fluorine radicals) may be primarily responsible for the etching of the sacrificial layer. The second plasma 220 may be generated from a second process gas alone or in combination with the first process gas. In various embodiments, the second process gas may comprise fluorine. In certain embodiments, the second process gas may comprise nitrogen trifluoride ($NF_3$), sulfur hexafluoride ($SF_6$), carbon tetrafluoride ($CF_4$), fluoroform ($CHF_3$), difluoromethane ($CH_2F_2$), or fluoromethane ($CH_3F$). In one or more embodiments, a continuous flow of the first process gas (e.g., $N_2$ and $H_2$) may be maintained while flowing the second process gas (e.g., $NF_3$). In certain embodiments, the second process gas may also include a carrier gas such as a noble gas (e.g., He, Ne, Ar, and Kr). In one or more embodiments, an optional purge step may be performed using an inert gas between the passivation phase and the etch phase of the lateral etch process. In one embodiment, the RF power applied for the first plasma 210 may be maintained, reduced, or turned off during such an optional purge step.

In certain embodiments, the lateral etch process may be based on using an oxygen-free plasma. The use of oxygen-free plasma for the lateral etch process may be beneficial because an oxide-based passivation layer for the nanosheets 110 may consume a significant portion of the nanosheets 110 (e.g., SiGe).

FIG. 3 illustrates a cross-sectional view of alternating nanosheets 110 and sacrificial layers 120 during a lateral etch process using another plasma 310 in a plasma processing chamber 200 that suffers pitting, selectivity, and roughness issues.

As illustrated in FIG. 3, if a lateral etch is performed without adequate passivation for the nanosheets 100, the lateral recesses 145 may be formed with poor surface profiles due to non-selective etching. Because the surfaces of the nanosheets 110 are not sufficiently protected, reactive species (e.g., fluorine species 216) of the plasma 310 may etch both the nanosheets 110 and the sacrificial layers 120. The non-selective etching may slow down the etching of the sacrificial layers 120 because reactive species are consumed by the etching of the nanosheets 110 as well as the sacrificial layers 120. The reactive species can also cause pits on unprotected surface (pitting issue). Additionally, substantial deposition of the by-products of etching on surfaces may occur, worsening the surface profiles of the lateral recesses 145 (e.g., increased surface roughness). These issues may be overcome by utilizing the passivation phase in a lateral etch process in accordance with various embodiments. In one or more embodiments, the surface roughness of the lateral recesses 145 (e.g., root mean square of height variation, roughness average, or peak-to-valley height) may be reduced by employing the passivation phase in the lateral etch process. In certain embodiments, the etch selectivity of silicon (Si) to silicon-germanium (SiGe) may be between 5:1 and 90:1.

Figure 4:
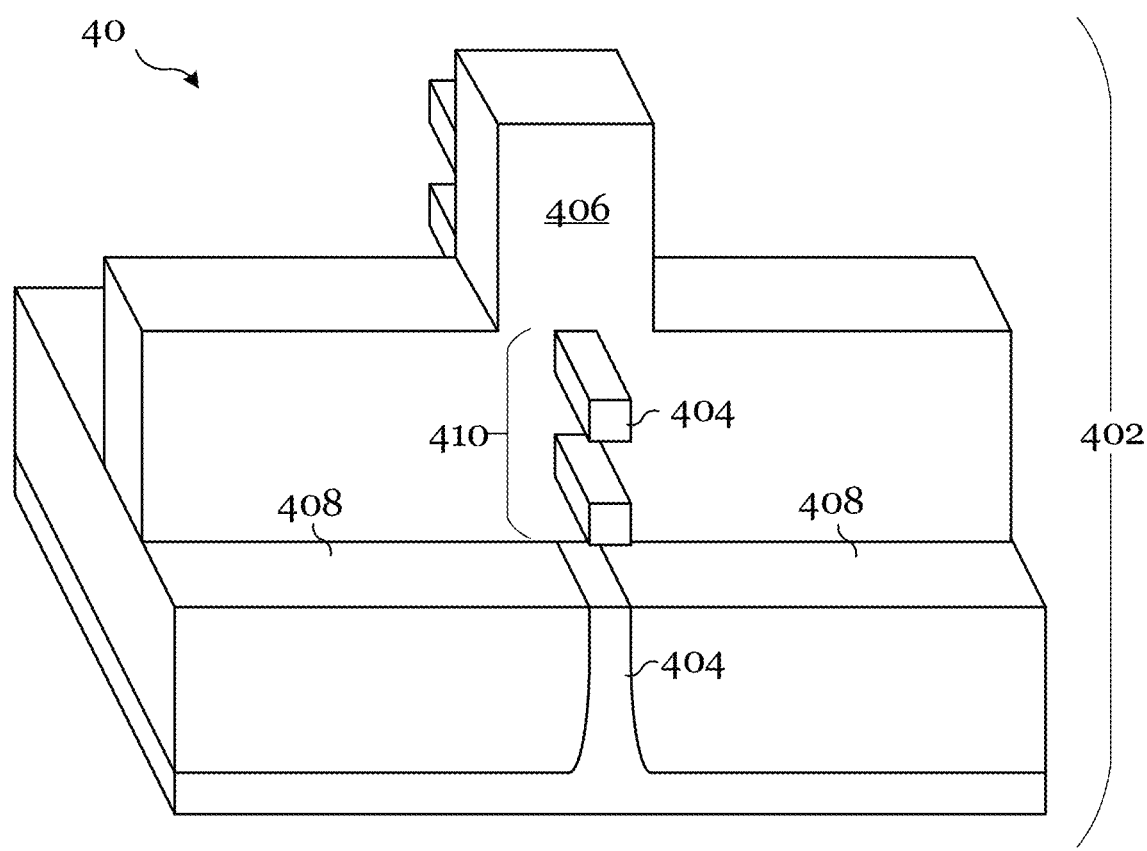
FIG. 4 illustrates an example device comprising nanosheet structures enabled by a lateral etch process in accordance with various embodiments.

FIG. 4 illustrates an example device 40 comprising nanosheet structures enabled by a lateral etch process in accordance with various embodiments.

At least a portion of the device 40 may be formed using the lateral etch processes in various embodiments. The device 40 comprises a substrate 402 that comprises a channel material 404 (e.g., Ge or SiGe) and a gate material 406, (e.g. Si). The channel material 404 may correspond to the nanosheets 110 of FIGS. 1A-1D and 2A-2B. Accordingly, the device 40 may be a gate-all-around (GAA) device as shown here or may be any other device, such as a fin field-effect transistor (FinFET). The device 40 may also comprise isolation regions 408. In certain embodiments, isolation regions 408 are shallow trench isolations (STIs).

The device 40 may be fabricated by first hetero-epitaxial growth of alternating Si and Ge or SiGe layers that forms an alternating film stack 410 (which may correspond to the structure as the incoming substrate 100 illustrated in FIG. 1A. The alternating film stack 410 may then be patterned and recessed vertically to expose sidewalls of the Ge or SiGe layers (FIG. 1B), followed by forming lateral recesses (FIGS. 1C-1D).

After completing the lateral etch process (e.g., FIGS. 1A-1D), subsequent processing may then be performed to proceed in semiconductor device fabrication for the device 40. In various embodiments, the subsequent processing may comprise filling the lateral recesses with an insulator (i.e., inner spacer formation), epitaxial growth of a semiconductor region (i.e., source/drain formation), removing remaining portions of the sacrificial layers (i.e., channel release), providing the gate material 406 around the channel material 404, and other associated steps, all of which are provided for example purposes only.

The application of various embodiments described herein may advantageously be an optimal solution for the 5 nm node, 3 nm node, or lower. For example, the GAA device architecture may be suitable for scaling beyond the 7 nm node. The GAA device architecture may address short channel effects found in some FinFET architectures by wrapping the gate around the entire channel instead of only three sides. This could reduce or eliminate current leakage occurring under the gate of the FinFET, therefore reducing non-active power losses.

In various embodiments, the passivation phase and the etch phase of the lateral etch process may advantageously repeated as a part of a cyclic process so that the passivation layers 140 may be replenished and/or extended into the surfaces of the nanosheets 110 within the lateral recesses 145 (FIGS. 1D and 2B). In further embodiments, such a cyclic embodiment may be realized in a continuous fashion by pulsing the second process gas into the plasma processing chamber while continuously flowing the first process gas and applying sufficient source power to maintain the plasma. In response to the pulsing, the plasma composition in the plasma processing chamber may dynamically switch between the two conditions: the passivation phase (when the second process gas flow is OFF) and the etch phase (when the second process gas flow is ON).

Figure 5:
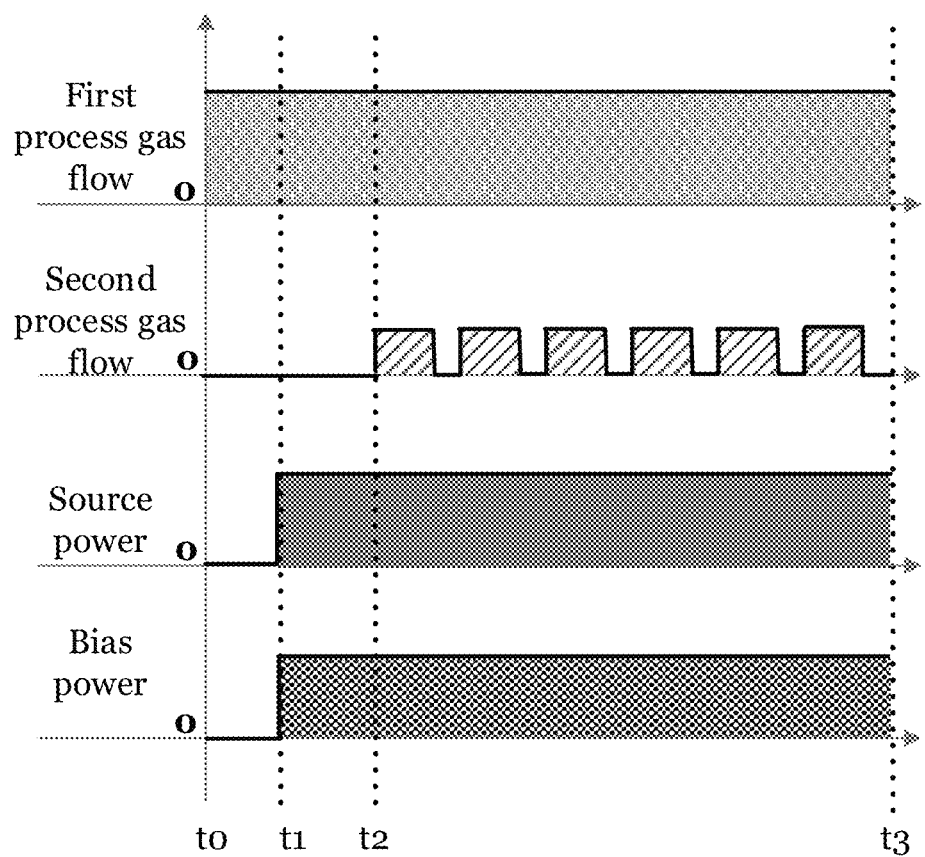
FIG. 5 illustrates an example timing diagram of various parameters for a lateral etch process in accordance with various embodiments.
Figure 6A:
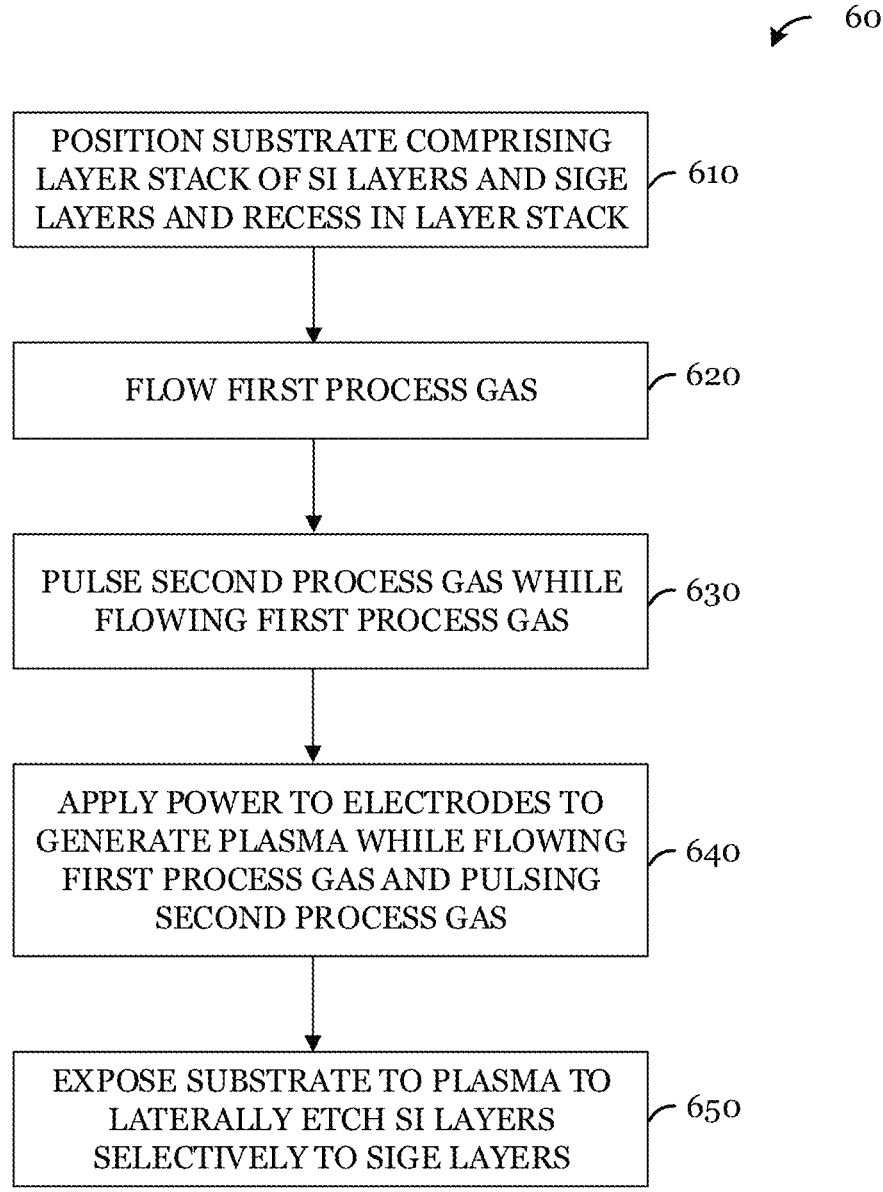
Figure 6B:
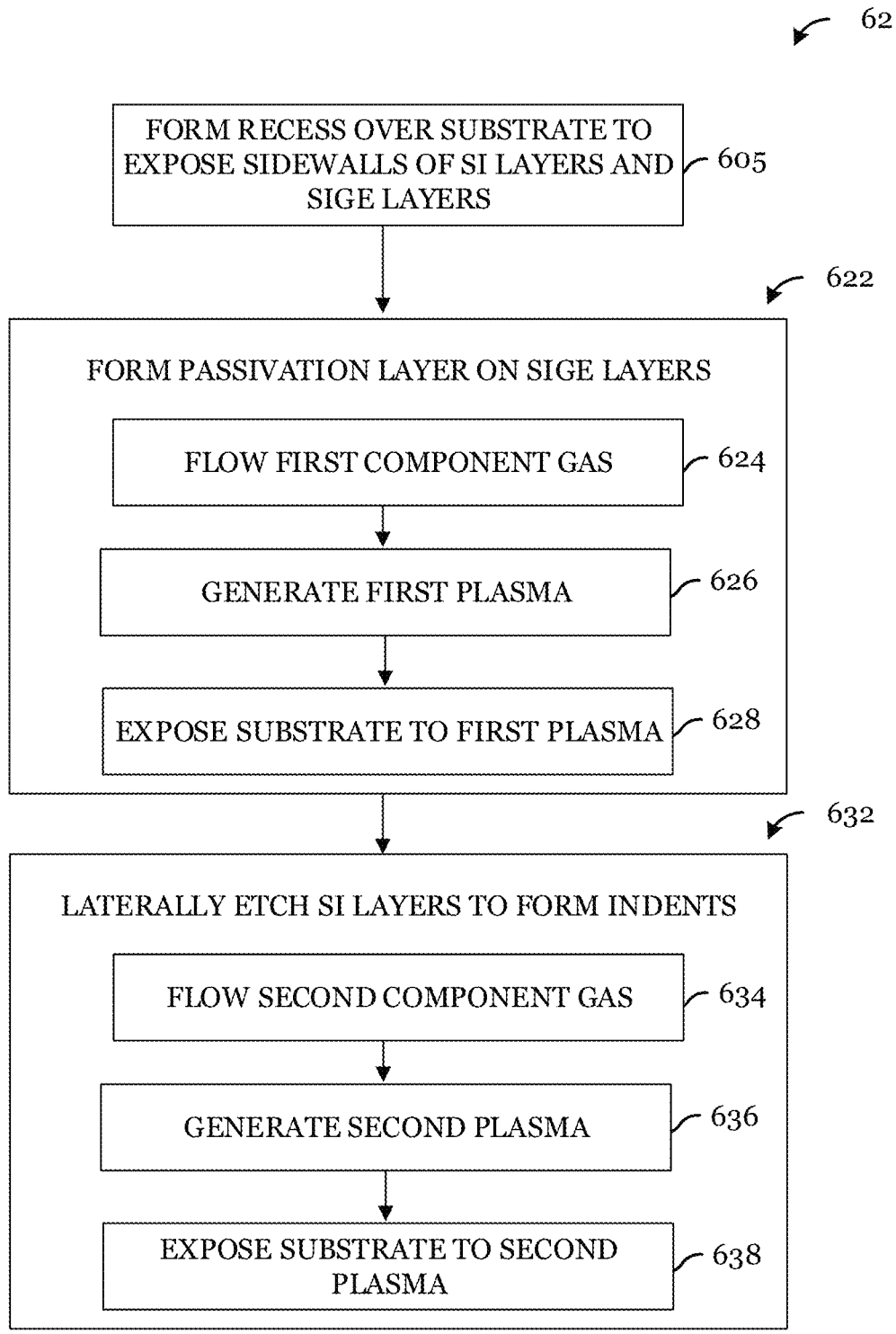
Figure 6C:
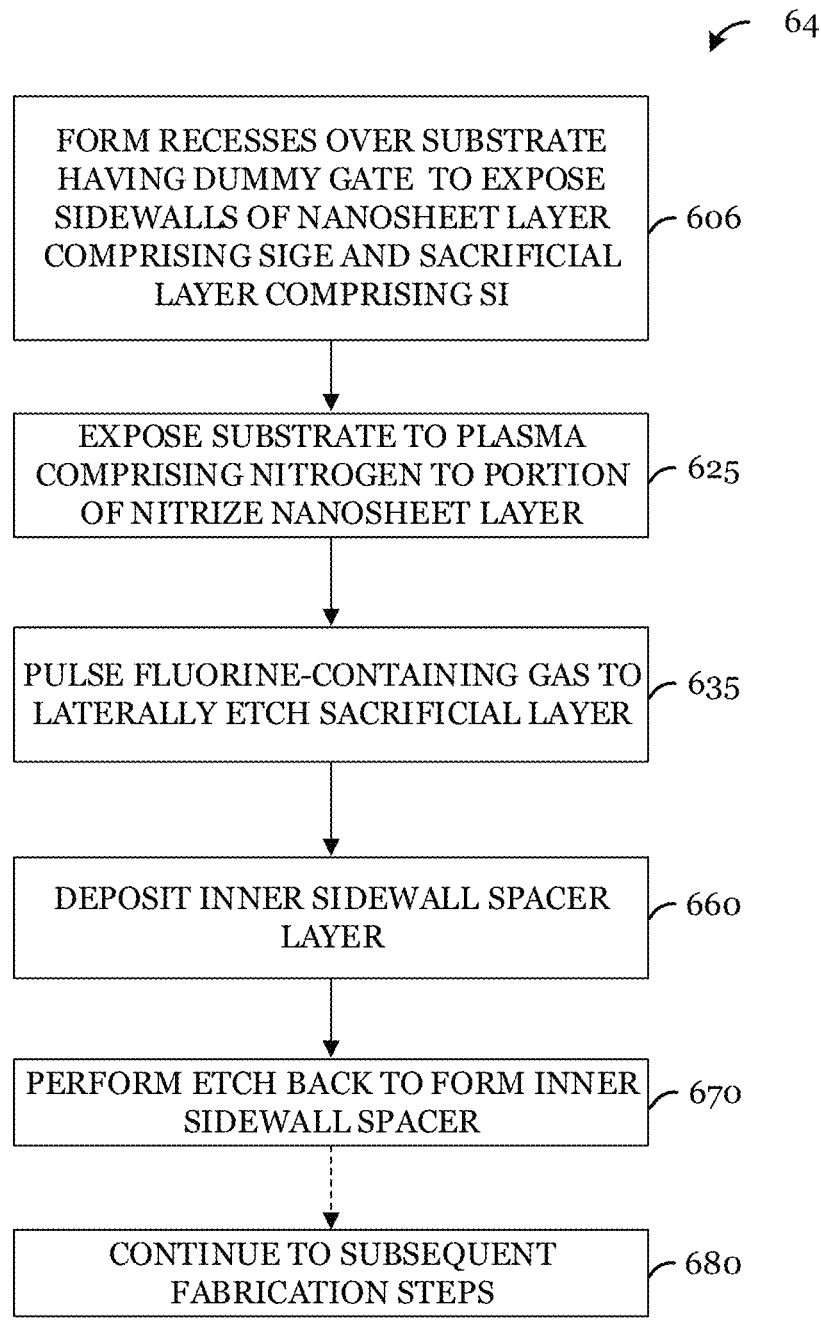

FIG. 5 illustrates an example timing diagram of various parameters for a lateral etch process with a pulsing mode in accordance with various embodiments.

In FIG. 5, four horizontal axes represent progression in time. The four time axes are used to schematically display plots of four process parameters vs. time for a period of the lateral etch process. A period of process time from $t_0$ to $t_3$ is illustrated. The four process parameters plotted in FIG. 5 are the gas flow rate of the first process gas, the gas flow rate of the second process gas, the source power, and the bias power. Although not specifically described in FIG. 5, any other process parameters such as temperature may be controlled independently at any time during the lateral etch process in accordance with the respective process recipe.

In FIG. 5, at $t_0$, the first process gas (e.g., $N_2$ and $H_2$) may be started to flow into a plasma processing chamber at a first flow rate and kept constant for the period of the process. In certain embodiments, a flow rate of the first process gas may between 50 sccm and 200 sccm. In one or more embodiment, the first process gas comprises $N_2$ and $H_2$ and their flow rates are between 40 sccm and 160 sccm and between 10 sccm and 40 sccm, respectively. At $t_1$, the source power and the bias power are turned on and a plasma is generated in the plasma processing chamber. In one or more embodiments, the source power of 100-500 W and the bias power of 0-50 W may be applied. At this stage, having only the species from the first process gas in the plasma process chamber, the plasma may not cause any etching but passivation (i.e., the passivation phase). The time between $t_1$ and $t_2$ defines the duration of the initial passivation phase, and controlling the process time for the passivation phase may allow the formation of a sufficient amount of the passivation layers 140 on the nanosheets 110 while avoiding or minimizing the formation of layer over the sacrificial layers 120. In one or more embodiments, the process time for the initial passivation may be between 5 s and 5 min. In one embodiment, the process time for the initial passivation may be shorter than a process time for the etch phase. Starting the lateral etch process with passivation may advantageously ensure the following etch phases may be sufficiently selective to the nanosheets 110.

At $t_2$, pulsing of the second process gas (e.g., $NF_3$) may be started at a pulsing frequency. By introducing the second process gas comprising, for example, fluorine, into the plasma processing chamber, the already present plasma used for passivation is provided with etchants, thus starting the etch phase. In the illustrated example of FIG. 5, since the second process gas is provided as a pulse, the concentration of the etchants in the plasma may substantially fluctuate in response to the pulsing, advantageously enabling the periodic switching the passivation phase and the etch phase between $t_2$ and $t_3$. It should be noted, however, that the plasma during the off-phase of the pulsing (e.g., the passivation phases between $t_2$ and $t_3$) may or may not be completely etchant free (e.g., fluorine radical). The actual concentrations of various species in the plasma processing chamber depend on lifetime of the species as well as various process parameters such as pressure, pumping speed, and gas flow rates. In certain embodiments, due to the high pressure and its short lifetime, the concentration of the etchant (e.g., fluorine radical) may depends on the residence time, which may be 1 s or shorter. Therefore, after a few seconds of the off-phase of the pulsing, the plasma processing chamber may be assumed essentially etchant free until the next on-phase of the pulsing. In one embodiment, the concentration of the etchant may be up to 10%.

In various embodiments, the pulsing frequency for the second process gas may be between 0.005 Hz and 50 Hz, or between 0.01 Hz and 1 Hz in other embodiments. The flow rate of the second process gas during the on-phase of the pulsing may be between 5 sccm and 50 sccm. In various embodiments, the duty cycle of the pulsing may be between 10% and 80%. The ratio of the flow rate of the first process gas to the flow rate of the second process gas may be between 5:1 and 100:1 in certain embodiments.

In other embodiments, the pulsing of the second process gas (e.g., $t_2$) may be started at the same time as, or prior to, providing the source power and the bias power (e.g., $t_1$). For example, when these two steps are performed at the same time, the first etch phase may precede the first passivation phase. Alternately, the plasma may be generated after starting the second process gas, which may be advantageous to ensure stable gas flow in the plasma processing chamber. In these embodiments, the first phase of the lateral etch process may be passivation or etch depending on the timing of generating the plasma.

The conditions of the process parameters illustrated in FIG. 5 are example only, and other process recipe with different conditions are also possible. For example, the plasma may be sustained in the plasma processing chamber by applying power pulse trains for source power, bias power, or both. The source power and bias power may be changed at any point during the process, including during an optional purge step. In one embodiment, a first set of power conditions may be used for the passivation phase and a second set of power conditions may be used for the etch phase. In another embodiment, the power conditions may be adjusted as the lateral recess is being extended. The flow rates of the first process gas and the second process gas, as well as the gas compositions, may be changed at any point during the process. In one embodiment, at $t_2$, when the pulsing of the second process gas is started, the flow rate of the first process gas may advantageously be reduced such that the total gas flow (or the time-averaged total gas flow) may remain unchanged. In another embodiment, the first process gas may be pulsed. In yet another embodiment, the composition of the first process gas may be changed by pulsing one of the components of the first process gas (e.g., $NH_3$, $H_2$, $N_2$, or a combination thereof) at varying timings.

Various embodiments of the lateral etch process may be performed using any suitable type of plasma processing system, including an inductively-coupled plasma (ICP) tool, a capacitively-coupled plasma (CCP) tool, a surface wave plasma (SWP) tool, a resonator such as a helical resonator, and others. Although not described herein, embodiments of the present invention may be also applied to remote plasma systems as well as batch systems.

FIGS. 6A-6C illustrate example process flow diagrams of the fabrication process comprising a lateral etch process. The process flow can be followed with the figures (FIGS. 1A-1D, and 2A-2B) discussed above and hence will not be described again.

In FIG. 6A, a process flow 60 starts with positioning in a plasma processing chamber a substrate that comprises a layer stack of alternating layers of silicon (Si) layers and silicon-germanium (SiGe) layers and a recess in the later stack (block 610, FIG. 1B). A first process gas may then be supplied to the plasma processing chamber (block 620), and while flowing the first process gas, a second process gas may then be pulsed into the plasma processing chamber (block 630). Next, while flowing the first process gas and pulsing the second process gas, power may be applied to a source electrode and a bias electrode of the plasma processing chamber to generate a plasma in the plasma processing chamber (block 640), and the substrate may be exposed to the plasma to laterally etch a portion of the Si layers selectively to the SiGe layers and form indents between the SiGe layers (block 650, FIGS. 1C-1D).

In FIG. 6B, a process flow 62 starts with forming a recess over a substrate that comprises a layer stack of alternating layers of Si layers and SiGe layers and exposing sidewalls of the Si layers and sidewalls of the SiGe layers (block 605, FIG. 1B). Next, forming passivation layers on surfaces of the SiGe layers (block 622, FIG. 1C) may be performed by flowing a first component gas into a plasma processing chamber (block 624), generating a first plasma within the plasma processing chamber (block 626), and subsequently exposing the substrate to the first plasma (block 628). After passivating the SiGe layers, a portion of the Si layers may be laterally etched (block 632, FIG. 1D) to form indents between the SiGe layers by flowing a second component gas into the plasma processing chamber (block 634), generating a second plasma within the plasma processing chamber (block 636), and exposing the substrate to the second plasma (block 638).

In FIG. 6C, a process flow 64 starts with forming vertical recesses in a layer stack of alternating layers of Si-containing sacrificial layer and Ge-containing nanosheet layer over a substrate that comprises a dummy gate (block 606, FIG. 1B). The substrate may be then exposed to a plasma comprising nitrogen from a first process gas in a plasma processing chamber to induce nitridation of a portion of surfaces of the Ge-containing nanosheet layer (block 625, FIG. 1C). Next, while maintaining the plasma and flowing the first process gas, a second process gas comprising fluorine may be pulsed to the plasma processing chamber to laterally etches a portion of the sacrificial layer and forms lateral recesses between adjacent nanosheets (block 635, FIG. 1D). After the lateral etch process, an inner sidewall spacer layer may be deposited (block 660) to fill the lateral recesses, followed by an etch back to expose tips of the nanosheets (block 670) to complete the formation of inner sidewall spacer. Subsequently, in certain embodiments, the process flow 64 may proceed to various additional steps (block 680) such as epitaxial growth of a semiconductor region (i.e., source/drain formation), removing remaining portions of the sacrificial layers (i.e., channel release), and providing a gate material around the nanosheets.

Example embodiments of the invention are summarized here. Other embodiments can also be understood from the entirety of the specification as well as the claims filed herein.

Example 1. A method of processing a substrate that includes: positioning a substrate in a plasma processing chamber, the substrate including a layer stack of alternating layers of silicon (Si) layers and silicon-germanium (SiGe) layers, the substrate including a recess that exposes sidewalls of the Si layers and sidewalls of the SiGe layers; flowing a first process gas into the plasma processing chamber; while flowing the first process gas, pulsing a second process gas into the plasma processing chamber at a pulsing frequency, the second process gas being different from the first process gas; while flowing the first process gas and pulsing the second process gas, applying power to a source electrode and a bias electrode of the plasma processing chamber to generate a plasma in the plasma processing chamber; and exposing the substrate to the plasma to laterally etch a portion of the Si layers selectively to the SiGe layers and form indents between the SiGe layers.

Example 2. The method of example 1, where the first process gas includes nitrogen and the second process gas includes fluorine.

Example 3. The method of one of examples 1 or 2, where the first process gas includes $N_2$ and $H_2$, or the first process gas includes $NH_3$.

Example 4. The method of one of examples 1 to 3, where the second process gas includes $NF_3$, $SF_6$, $CF_4$, $CHF_3$, $CH_2F_2$, or $CH_3F$.

Example 5. The method of one of examples 1 to 4, where the plasma forms a passivation layer on surfaces of the SiGe layers, the surfaces of the SiGe layers including the sidewalls of the SiGe layers.

Example 6. The method of one of examples 1 to 5, where the pulsing frequency is between 0.01 Hz and 1 Hz.

Example 7. The method of one of examples 1 to 6, where a duty cycle of the pulsing is between 10% and 80%.

Example 8. The method of one of examples 1 to 7, where a ratio of a flow rate of the first process gas to a flow rate of the second process gas is between 5:1 and 100:1.

Example 9. The method of one of examples 1 to 8, where applying the power to the source electrode and the bias electrode to generate the plasma is performed when the second process gas is flowing into the plasma processing chamber.

Example 10. The method of one of examples 1 to 9, where applying the power to the source electrode and the bias electrode includes applying power pulse trains.

Example 11. A method of processing a substrate, the method including: forming a recess over a substrate, the substrate including a layer stack of alternating layers of silicon (Si) layers and silicon-germanium (SiGe) layers, the recess exposing sidewalls of the Si layers and sidewalls of the SiGe layers; forming passivation layers on surfaces of the SiGe layers, the surfaces including the exposed sidewalls of the SiGe layers, the forming including flowing a first component gas into a plasma processing chamber, generating a first plasma within the plasma processing chamber, and exposing the substrate to the first plasma; and laterally etching a portion of the Si layers to form indents between the SiGe layers, the laterally etching including flowing a second component gas into the plasma processing chamber, generating a second plasma within the plasma processing chamber, exposing the substrate to the second plasma, and where the second plasma is different from the first plasma, and where the passivation layers inhibit an etching of the SiGe layers by the second plasma.

Example 12. The method of example 11, where the first component gas includes $N_2$ and $H_2$, and the second process gas includes $NF_3$, $SF_6$, $CF_4$, $CHF_3$, $CH_2F_2$, or $CH_3F$.

Example 13. The method of one of examples 11 or 12, where the laterally etching further includes continuously flowing the first component gas into the plasma processing chamber, and where the flowing of the second component gas into the plasma processing chamber is performed intermittently.

Example 14. The method of one of examples 11 to 13, where exposing the substrate to the first plasma is performed for a duration between 5 sec and 5 min.

Example 15. The method of one of examples 11 to 14, further including repeating the forming and the laterally etching.

Example 16. A method of processing a substrate, the method including: forming a plurality of vertical recesses in a layer stack, the layer stacking being disposed over the substrate, the layer stack including alternating layers of a nanosheet layer including germanium (Ge) and a sacrificial layer including silicon (Si), the substrate further including a dummy gate formed over the layer stack, the plurality of vertical recesses exposing sidewalls of the nanosheet layer and sidewalls of the sacrificial layer; exposing the substrate to a plasma including nitrogen within a plasma processing chamber to induce nitridation of a portion of surfaces of the nanosheet layer, the plasma being generated by flowing a first process gas including nitrogen to the plasma processing chamber; while maintaining the plasma and flowing the first process gas, pulsing a second process gas including fluorine to the plasma processing chamber to supply fluorine to the plasma, where the plasma supplied with fluorine laterally etches a portion of the sacrificial layer and forms a plurality of lateral recesses between adjacent nanosheets; depositing an inner sidewall spacer layer to fill the plurality of lateral recesses; and etching a portion of the inner sidewall spacer layer to expose tips of the nanosheets, the remaining portion of the inner sidewall spacer layer forming an inner sidewall spacer.

Example 17. The method of example 16, further including, before forming the plurality of vertical recesses, forming multi-layer spacers over the dummy gate.

Example 18. The method of one of examples 16 or 17, further including, after etching the portion of the inner sidewall spacer layer, epitaxially growing a semiconductor region from the exposed tips of the nanosheets.

Example 19. The method of one of examples 16 to 18, where the nanosheet layer is a silicon-germanium layer including 5-50% germanium.

Example 20. The method of one of examples 16 to 19, where the lateral recesses have a depth between 10 nm and 80 nm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    positioning a substrate in a plasma processing chamber, the substrate comprising a layer stack of alternating layers of silicon (Si) layers and silicon-germanium (SiGe) layers, the substrate comprising a recess that exposes sidewalls of the Si layers and sidewalls of the SiGe layers;
    flowing a first process gas into the plasma processing chamber;
    while flowing the first process gas, pulsing a second process gas into the plasma processing chamber at a pulsing frequency, the second process gas being different from the first process gas;
    while flowing the first process gas and pulsing the second process gas, applying power to a source electrode and a bias electrode of the plasma processing chamber to generate a plasma in the plasma processing chamber; and
    exposing the substrate to the plasma to laterally etch a portion of the Si layers selectively to the SiGe layers and form indents between the SiGe layers.

2. The method of claim 1, wherein the first process gas comprises nitrogen and the second process gas comprises fluorine.

3. The method of claim 1, wherein the first process gas comprises $N_2$ and $H_2$, or the first process gas comprises $NH_3$.

4. The method of claim 1, wherein the second process gas comprises $NF_3$, $SF_6$, $CF_4$, $CHF_3$, $CH_2F_2$, or $CH_3F$.

5. The method of claim 1, wherein the plasma forms a passivation layer on surfaces of the SiGe layers, the surfaces of the SiGe layers comprising the sidewalls of the SiGe layers.

6. The method of claim 1, wherein the pulsing frequency is between 0.01 Hz and 1 Hz.

7. The method of claim 1, wherein a duty cycle of the pulsing is between 10% and 80%.

8. The method of claim 1, wherein a ratio of a flow rate of the first process gas to a flow rate of the second process gas is between 5:1 and 100:1.

9. The method of claim 1, wherein applying the power to the source electrode and the bias electrode to generate the plasma is performed when the second process gas is flowing into the plasma processing chamber.

10. The method of claim 1, wherein applying the power to the source electrode and the bias electrode comprises applying power pulse trains.

11. A method of processing a substrate, the method comprising:
   forming a recess over a substrate, the substrate comprising a layer stack of alternating layers of silicon (Si) layers and silicon-germanium (SiGe) layers, the recess exposing sidewalls of the Si layers and sidewalls of the SiGe layers;
   forming passivation layers on surfaces of the SiGe layers, the surfaces comprising the exposed sidewalls of the SiGe layers, the forming comprising
      flowing a first component gas into a plasma processing chamber,
      generating a first plasma within the plasma processing chamber, and
      exposing the substrate to the first plasma; and
   laterally etching a portion of the Si layers to form indents between the SiGe layers, the laterally etching comprising
      flowing a second component gas into the plasma processing chamber,
      generating a second plasma within the plasma processing chamber,
      exposing the substrate to the second plasma, and
   wherein the second plasma is different from the first plasma, and
   wherein the passivation layers inhibit an etching of the SiGe layers by the second plasma.

12. The method of claim 11, wherein the first component gas comprises $N_2$ and $H_2$, and the second component gas comprises $NF_3$, $SF_6$, $CF_4$, $CHF_3$, $CH_2F_2$, or $CH_3F$.

13. The method of claim 11, wherein the laterally etching further comprises continuously flowing the first component gas into the plasma processing chamber, and wherein the flowing of the second component gas into the plasma processing chamber is performed intermittently.

14. The method of claim 11, wherein exposing the substrate to the first plasma is performed for a duration between 5 sec and 5 min.

15. The method of claim 11, further comprising repeating the forming and the laterally etching.

16. A method of processing a substrate, the method comprising:
   forming a plurality of vertical recesses in a layer stack, the layer stacking being disposed over the substrate, the layer stack comprising alternating layers of a nanosheet layer comprising germanium (Ge) and a sacrificial layer comprising silicon (Si), the substrate further comprising a dummy gate formed over the layer stack, the plurality of vertical recesses exposing sidewalls of the nanosheet layer and sidewalls of the sacrificial layer;
   exposing the substrate to a plasma comprising nitrogen within a plasma processing chamber to induce nitridation of a portion of surfaces of the nanosheet layer, the plasma being generated by flowing a first process gas comprising nitrogen to the plasma processing chamber;
   while maintaining the plasma and flowing the first process gas, pulsing a second process gas comprising fluorine to the plasma processing chamber to supply fluorine to the plasma, wherein the plasma supplied with fluorine laterally etches a portion of the sacrificial layer and forms a plurality of lateral recesses between adjacent nanosheets;
   depositing an inner sidewall spacer layer to fill the plurality of lateral recesses; and
   etching a portion of the inner sidewall spacer layer to expose tips of the nanosheets, the remaining portion of the inner sidewall spacer layer forming an inner sidewall spacer.

17. The method of claim 16, further comprising, before forming the plurality of vertical recesses, forming multi-layer spacers over the dummy gate.

18. The method of claim 16, further comprising, after etching the portion of the inner sidewall spacer layer, epitaxially growing a semiconductor region from the exposed tips of the nanosheets.

19. The method of claim 16, wherein the nanosheet layer is a silicon-germanium layer comprising 5-50% germanium.

20. The method of claim 16, wherein the lateral recesses have a depth between 10 nm and 80 nm.

* * * * *